United States Patent
Brewington et al.

[11] Patent Number: 6,071,128
[45] Date of Patent: Jun. 6, 2000

[54] INTEGRATED CIRCUIT SOCKET WITH BUILT IN EMC GROUNDING FOR A HEAT SINK

[75] Inventors: James Gabriel Brewington, Raleigh; Paul Daniel Kangas, Cary, both of N.C.

[73] Assignee: International Business Machines Corporation, Armonk, N.Y.

[21] Appl. No.: 09/067,395

[22] Filed: Apr. 28, 1998

[51] Int. Cl.[7] .................................................. H01R 9/09
[52] U.S. Cl. ............................................. 439/73; 361/704
[58] Field of Search ................................ 439/73, 331, 92, 439/95; 361/703–705, 709, 710, 712

[56] References Cited

U.S. PATENT DOCUMENTS

| | | | |
|---|---|---|---|
| 5,031,028 | 7/1991 | Galich et al. | 357/81 |
| 5,495,392 | 2/1996 | Shen | 361/697 |
| 5,541,811 | 7/1996 | Henningsson et al. | 361/704 |
| 5,566,052 | 10/1996 | Hughes | 361/704 |
| 5,600,540 | 2/1997 | Blomquist | 361/704 |
| 5,602,719 | 2/1997 | Kinion | 361/704 |

OTHER PUBLICATIONS

Intel "Pentium® Processor with MMX™ Technology", Jun. 1997 #243185.004.

*Primary Examiner*—Lincoln Donovan
*Assistant Examiner*—J. F. Duverne
*Attorney, Agent, or Firm*—John D. Flynn

[57] ABSTRACT

An integrated circuit socket 41 with built in EMC grounding for a heat sink 16 is provided. The socket 41 may be used with an electronic assembly 10 packaged with or without a planar card 20. The socket 41 includes or accepts one or more conductive fingers 53. The conductive fingers 53 are designed to extend down from the lug 81 of the socket 41 and form a pin. The socket body 41 may have two opposed side walls 71. Each side wall has a lug 81 that projects laterally out from the wall 71. A surface of each lug is coated or covered with a conductive material which forms the conductive finger 53. Each finger forms a pin which extends down from the socket 41 like other socket pins 50. Alternatively, the EMC fingers 55 are electrically coupled to one or more of the socket pins 50 via conductive traces 91/93. A curved upper portion of the finger 53/55 is designed to fit within the lug 81 such that solid electrical contact with the retainer clip 19 is maintained. The finger 53/55 electrically couples the ground plane of the planar card 20 to the heat sink 16 via the retainer clip 19.

24 Claims, 6 Drawing Sheets

INTEGRATED CIRCUIT SOCKET WITH BUILT IN EMC GROUNDING FOR A HEAT SINK

BACKGROUND OF THE INVENTION

1. Field of the Invention

The present invention relates to an electronic package assembly. In particular to a socket that utilizes EMC fingers for coupling a heat sink to the ground plane of a printed circuit card or planar using an integrated circuit socket.

2. Description of the Prior Art

Present day Integrated Circuit (IC) components are becoming more integrated and more complex. There has been a steady progression toward larger IC devices to permit inclusion of a greater number of functions on the device. The result is that the heat produced by these larger semiconductor devices is not adequately removed by either natural air convection nor by powered ventilation, such as a fan. Furthermore, clock frequencies and power generation constantly increase required electromagnetic shielding to prevent ElectroMagnetic Interference (EMI) with other devices. Microprocessors and microcontrollers being cases in point.

Convection cooling is performed by use of a heat sink that is directly applied to the device. It is not desirable to use a bonding process, such as an adhesive, because of the permanent nature of such attachment; a chip may be discarded if malfunctioning and it is not desirable to throw away the heat sink too. It has therefore been found desirable to attach the heat sink to the chip by mechanical means such as a retainer clip. The typical heat sink currently in use comprises a flat plate, generally of the same size as the device, with a plurality of radiation fins extending upwardly. The heat sink is commonly fabricated from aluminum and is extruded and subsequently machined. The heat sink can also be used in conjunction with a fan to obtain forced convection.

A parallel development in the electronic assembly art has been the provision of means for detachably securing large and generally expensive IC devices to a printed circuit board. The industry has developed sockets for this purpose. The socket is permanently attached to the board through soldering of a plurality of downwardly extending contact pins. The socket body includes an identical layout of holes into which the device may be inserted and then detachably locked into position. The socket is generally the same size as the device. It is highly desirable in electronic assemblies to achieve a commonality of parts from numerous suppliers so that the assembly company may select from multiple sources. Sockets for semiconductor devices are typically standardized for various chips and/or chip families.

When heat sinks are used to remove heat from electronic devices (e.g., microprocessor or microcontroller) the close proximity of the heat sink and electronic device permits electromagnetic energy to couple from the electronic device to the heat sink. The heat sink acts as an antenna for the electronic device. This energy radiates from the heat sink and may even be amplified by the heat sink which leads to undesirable EMI which can cause problems for other devices in the vicinity of the electronic device. This radiated energy may also lead to EMI readings which are unacceptable to the regulatory authority of a host country (e.g., in the United States the FCC).

One prior art solution included using a low EMC microprocessor. This of course is undesirable because lower EMC usually corresponds to slower processing speed and less processing power. Another prior art solution entails securing one or more grounding braids from the heat sink to the planar or printed circuit board (PCB) with screws or the like. This solution requires more space on the planar to secure the braids, costly extra parts (e.g.,the braids and the screws), additional manufacturing steps to attach and secure the braids, and inhibits easy removal of the electronic device. Another prior art solution is depicted in U.S. Pat. No. 5,541,811 entitled "Shielding and Cooling Arrangement". This prior art solution uses a shielding hood that completely covers the semiconductor device and requires more space on the planar then the socket and semiconductor device. With this solution it is more difficult to remove and access the electronic device. This solution also requires installation of, separate hook fasteners on the planar which requires additional manufacturing steps and additional assembly operations.

These unresolved problems and deficiencies are clearly felt in the art and are solved by the invention in the manner described below.

SUMMARY OF THE INVENTION

It is an object of the invention to provide a heat sink with EMI protection for an electronic device without entailing use of any additional space on the planar.

It is another object of the invention to provide a heat sink with EMI protection without additional manufacturing steps.

It is yet a further object of the present invention to provide an electronic packaging assembly that is easy to manufacture.

It is an object of the invention to provide an IC socket with built in EMI pins.

It is a further object of this invention to provide a heat sink with EMI protection that does not interfere with the removability of the heat sink.

It is another object to provide EMI protection without any additional assembly steps.

The above-mentioned needs have been met in accordance with the present invention by incorporating an EMI grounding mechanism into the assembly process which effectively grounds the heat sink to the planar during heat sink installation.

An integrated circuit socket with built in EMC grounding for a heat sink is provided. The socket includes or accepts one or more conductive fingers. The conductive fingers are designed to extend down from the lug of the socket and form a pin or to be electrically coupled to existing socket pins. The socket body may have two opposed side walls. Each side wall may have a lug that projects laterally out from the wall. A surface of each lug is coated or covered with a conductive material which forms the conductive finger. Each finger forms a pin which extends down from the socket like other socket pins or is electrically coupled to an existing socket pin. A curved upper portion of the finger is designed to fit within the lug such that solid electrical contact with the retainer clip is maintained. The finger electrically couples the ground plane of the PCB to the heat sink via the retainer clip and EMC finger.

BRIEF DESCRIPTION OF THE DRAWINGS

The foregoing and other objects, aspects and advantages of the invention will be better understood from the following detailed description with reference to the drawings, in which.

DETAILED DESCRIPTION

To illustrate the present invention, it is observed that one of the most popular microprocessor chips in use in the computer industry is the Intel family of microprocessors. These are generally large, high pin count, and relatively expensive components. They are typically mounted on a printed circuit board through a socket. Currently, the Intel family of microprocessors include the 80486 ('486), Pentium, Pentium PRO and Pentium II microprocessors. They are available in various configurations, performance, and sizes. The industry has developed a family of sockets to cooperate with these microprocessors. One example, is the family of sockets in the ZIF series offered by AMP Incorporated, Harrisburg, Pa. AMP offers the Socket 3, Socket 4, Socket 5 and Socket 7 and other types of sockets for use with the above-described Intel microprocessors.

Figure 1:
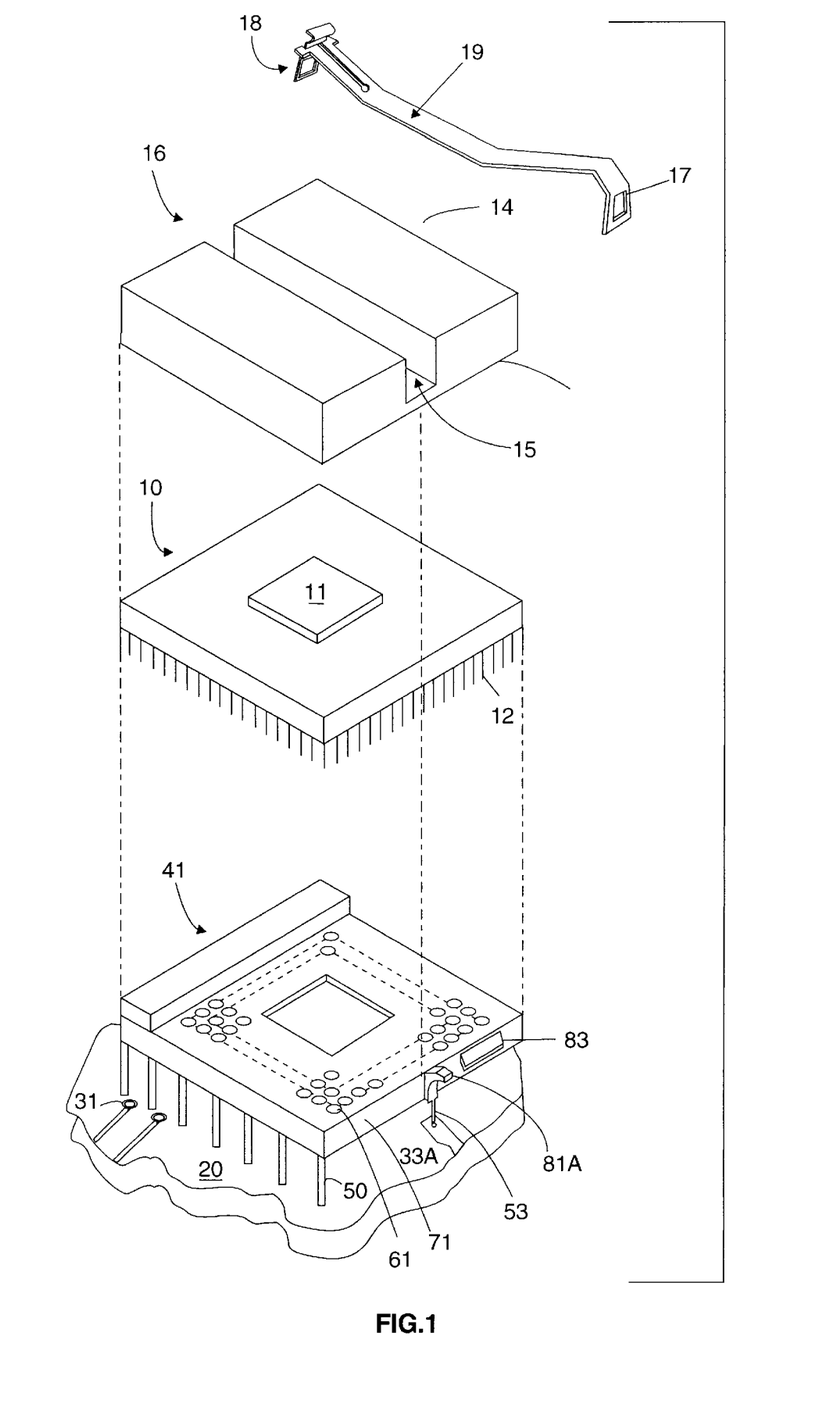
FIG. 1 is a exploded view of the elements of an electronic package assembly.
Figure 2:
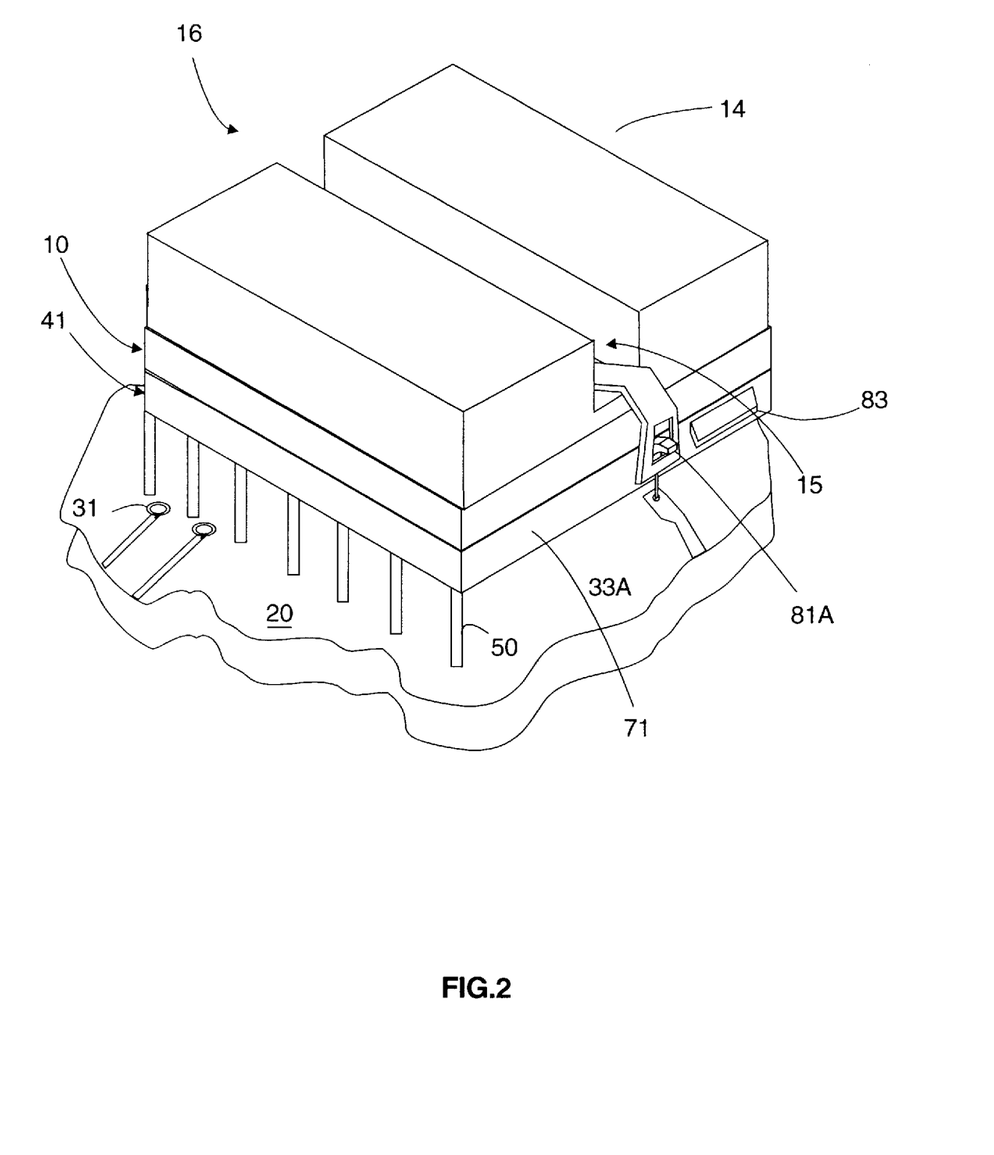
FIG. 2 is a perspective view of elements of an electronic assembly.

Referring to FIG. 1, there is shown a printed circuit board (PCB) 20 which may be of standard construction well known in the art and including a plurality of through-holes for solder mounting of the electronic devices, or sockets for supporting such devices for easier detachment from the printed circuit board. To facilitate the proper attachment of the heat sink 16 to the electronic device 10 and socket assembly 41, the socket 41 is provided with horizontally extending tabs or lugs 81A and 81B (not shown) on the side walls of the socket. These lugs cooperate with the heat sink retainer clip 18 to detachably secure the heat sink to the electronic device. All standardized sockets will have lugs in the same position. An example is the AMP sockets, generally known as the ZIF Socket 3, Socket 4, Socket 5 and Socket 7 family, for the Intel microprocessors.

A socket 41 is shown which is similar to the Socket 7 AMP socket type but, excludes some of the details of that socket. The socket 41 is typically constructed from molded plastic, or co-fired ceramic material, which has a coefficient of thermal expansion that corresponds to the coefficient of thermal expansion of the PCB 20. The socket 41 has a plurality of pins 50 projecting downwardly for insertion into the holes 31 of the PCB 20. The pins 50 can then be electrically coupled to conductors on the PCB by for instance, soldering. The number and position of the pins may be identical to the pins 12 on the electronic device 10. The socket body includes a plurality of holes 61 for receiving the pins on the electronic device 10. The electronic device 10 (e.g., Intel microprocessor) is mounted on the socket 41 by insertion of a plurality of pins 12 of the microprocessor into corresponding holes 61 in the socket 41. A locking assembly on the socket (not shown) may secure the device to the socket for easy release through actuation of a locking lever. The electronic device is electrically coupled to conductors on the PCB by the electronic device pins 12 and socket holes 61 and socket pins 50.

Figure 3:
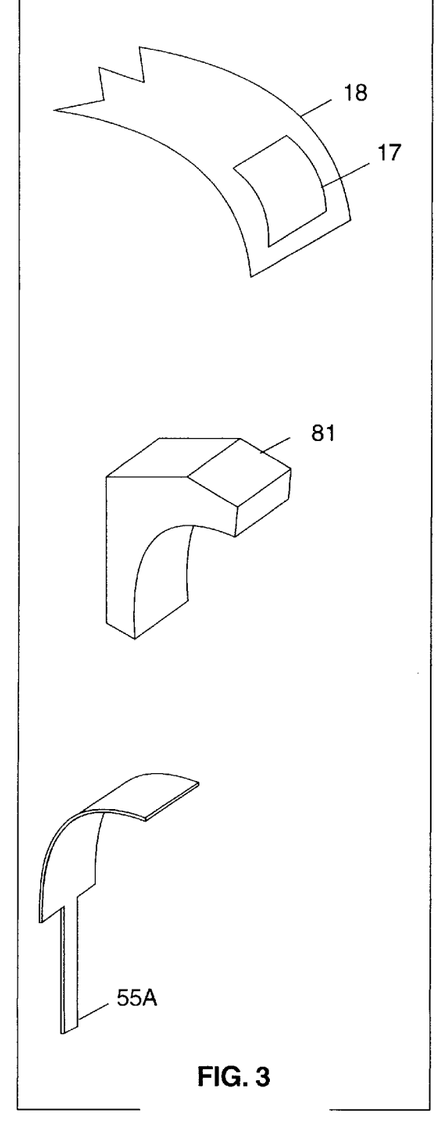
FIG. 3 is exploded view of a lug, EMC finger, and retainer clip.
Figure 4:
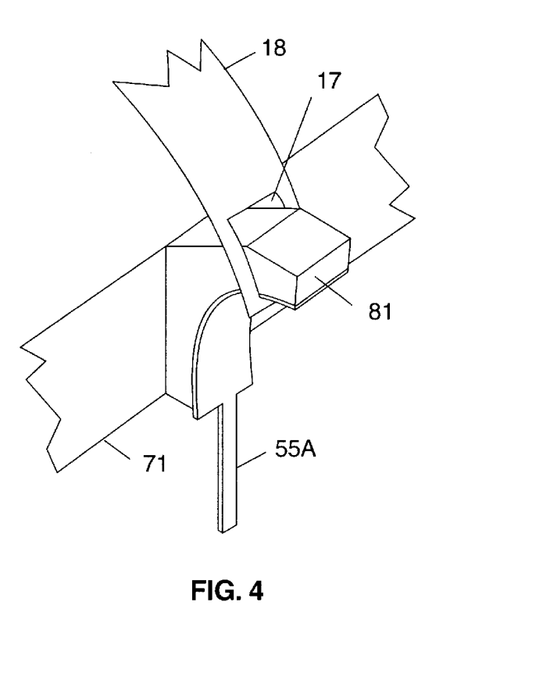
FIG. 4 is a perspective view of a lug, EMC finger, and retainer clip.

The socket includes or accepts one or more EMC fingers 53A. EMC finger 53B is not shown. The EMC finger is designed to extend down from the lug 81 and form a pin or multiple pins. These fingers can then be electrically coupled to the ground plane of the PCB (shown partially as 33A). The socket body is generally rectangular and has two opposed side walls, one of which is shown at 71. The side wall has a lug 81A that projects laterally out from the side wall. The inside surface of each lug 81 (or a subset of the lugs) is coated with a conductive material which forms the EMC finger 53A. An example EMC finger is shown in FIG. 3 and FIG. 4. Note that only lugs which are used by the retainer clip 18 to secure the heat sink need to have EMC fingers.

As shown in FIG. 3 and FIG. 4 the EMC finger forms a pin which extends down from the socket like other socket pins 50 (see FIG. 1). The curved upper portion of the EMC finger is designed to fit within the lug 81A such that solid electrical contact with the retainer clip is maintained. The EMC pin could then be electrically coupled to the ground plane of the PCB. As shown in FIG. 4 the EMC pin may extend down along the side wall of the socket body.

Figure 6:
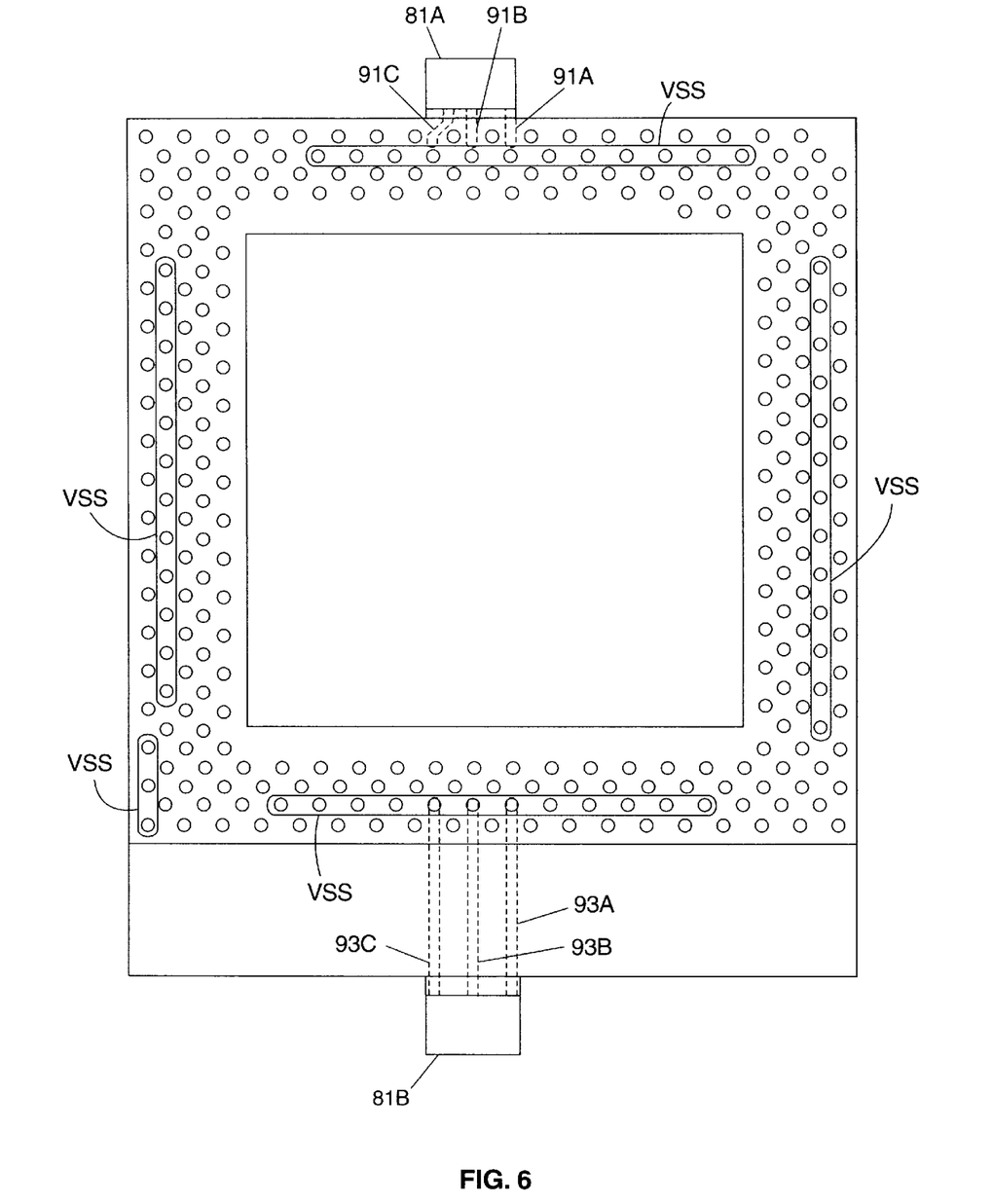
FIG. 6 is a bottom view of a socket with an integral formed EMC finger.
Figure 7:
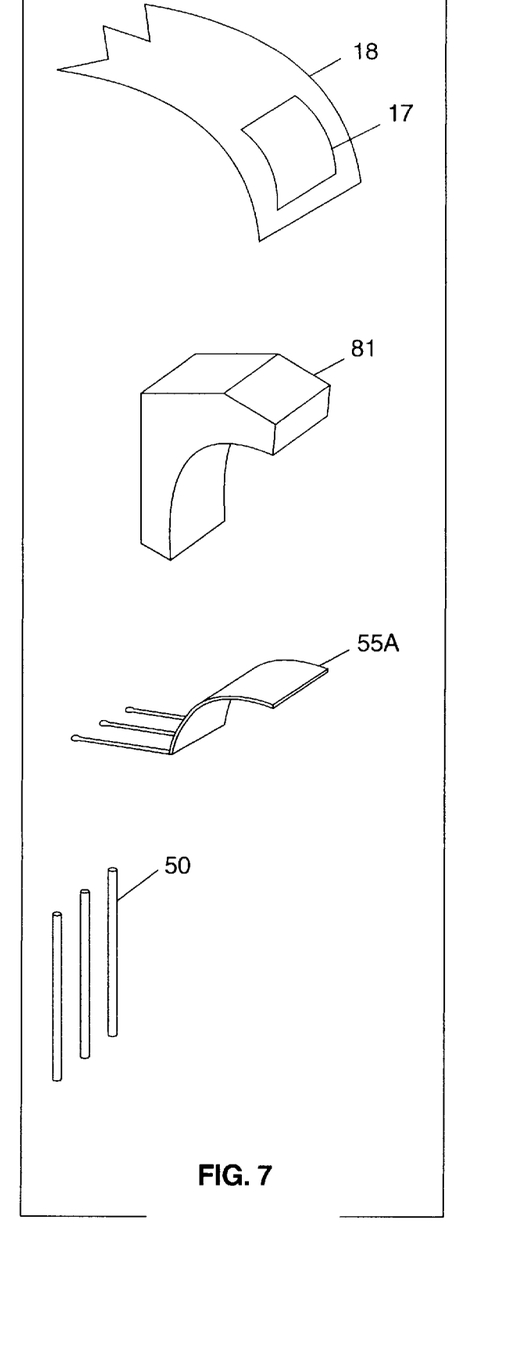
FIG. 7 is exploded view of a lug, integral EMC finger, and retainer clip.
Figure 8:
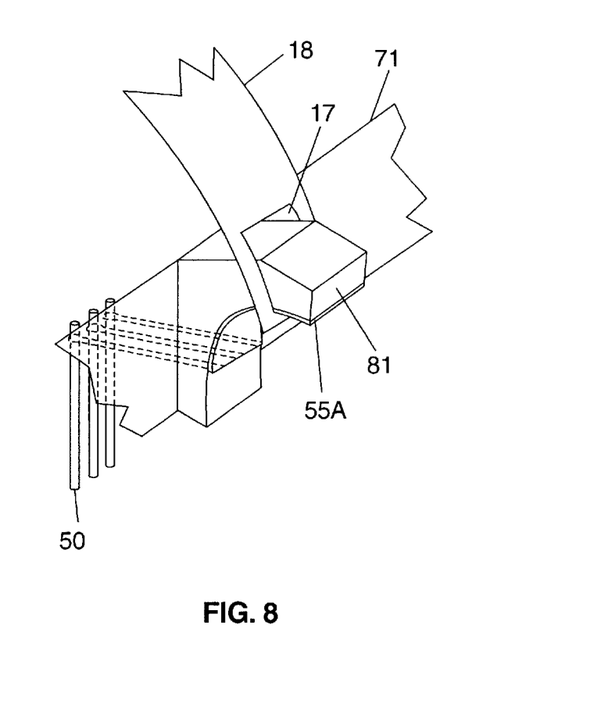
FIG. 8 is a perspective view of a lug, integral EMC finger, and retainer clip.

Alternatively, the EMC finger could penetrate the side wall and extend downward through the bottom wall of the socket. For instance, a metal finger is placed in the mold cavity for the socket, prior to filling the mold with plastic. As shown in FIG. 6 a bottom view of a ZIF 7 socket. Several of the pins are labeled with Vss to indicate ground for a Pentium Processor with MMX technology. Any of these pins may be used to provide a path to the ground plane of the planar. FIG. 6 depicts a plurality of traces 91A, 91B, 91C and 93A, 93B, 93C for each lug. In accordance with the invention only a single trace from one lug to one pin is necessary. As shown the under side of the lugs have a conductive material. An electrical path is provided by the pin, trace and portion of the EMC finger on the lug. The EMC fingers having conductive traces 91 and 93 which provide electrical paths from the portion of the EMC finger on the lugs 81A and 81B to several of the standard ground pins for a Pentium Processor with MMX technology. In this fashion no new pins (and thus no new holes on the planar) are needed to properly shield and ground the heat sink. A perspective view of the EMC finger with internal traces is shown in FIG. 8 with an exploded view in FIG. 7. The conductive EMC fingers could be molded into the plastic with traces going to the specified ground pins of the socket as shown or a special set of heat sink grounding pins can be provided. The traces may take any form such as standard wire conductor with or without insulating material. Although shown as within the socket body the traces may be external or partially external as long as they are properly insulated as required.

From a mechanical standpoint the insertion of metal pieces (e.g., metal inserts) in a plastic mold is well known. Typically the metal pieces are positioned in the mold prior to injecting the plastic. Once the plastic is injected, the plastic flows around the inserts.

A conductive fabric could be adhered to the socket and seated between the socket bottom and a ground plane pad on the board. The EMC finger may be integrated into the socket during the socket manufacturing process or assembled onto the PCB card with the socket. The EMC pin may be electrically coupled by soldering it to the ground plane.

Returning to FIG. 1, the electronic device 10 may make use of a heat spreader 11 which distributes the heat generated internal to the electronic device 10 throughout the device body, for more efficient dissipation of the heat and to prevent damage to any one spot within the electronic device. Not all chip packages include the heat spreader or heat slug.

Figure 5:
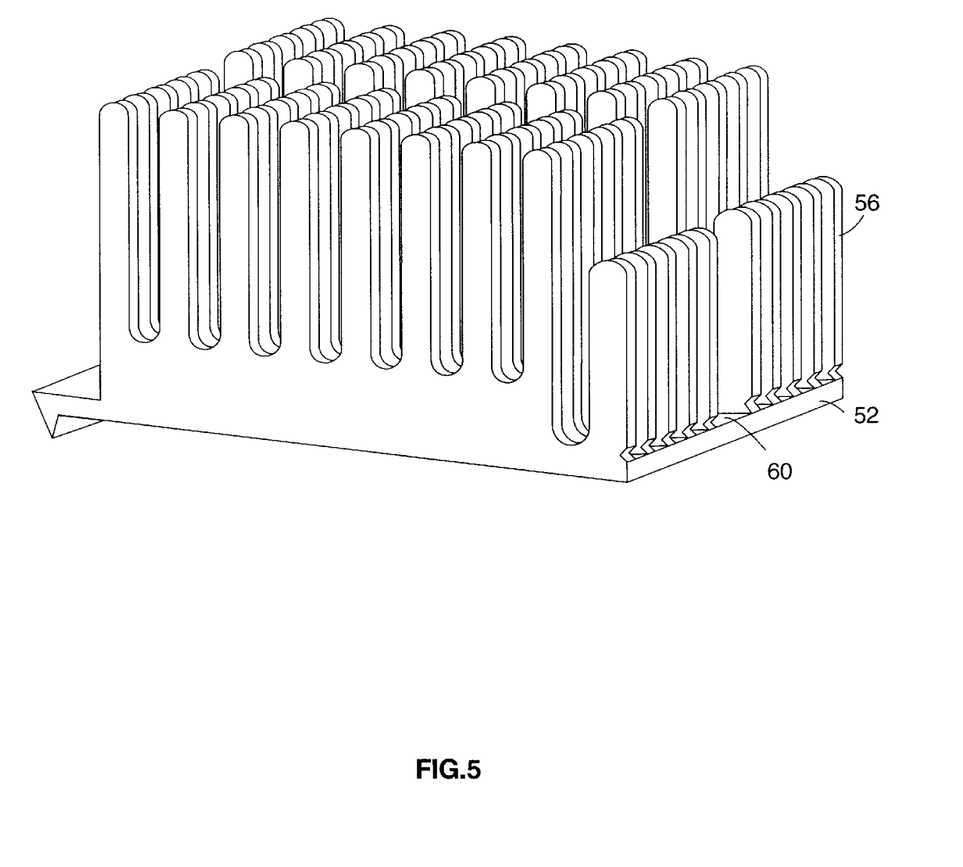
FIG. 5 is alternative heat sink.

The heat sink 16 may be of various constructions, but all heat sinks are fabricated or formed from a material with high thermal conductivity, such as Aluminum. The heat sink 16 is shown with a flat bottom surface 13. The heat sink is generally rectangular and its size is typically co-extensive with the size of the electronic device 10. The heat sink 16 shown in FIG. 1 is a block with a channel 15. In the preferred embodiment the central region of the heat sink has a channel 15 which extends across the heat sink for use in conjunction with the retainer clip 18. The channel cooperates with the retainer clip 18 and lugs 81 to secure the heat sink to the socket. One alternative heat sink has a large number of fins that are integral formed from a single extrusion as shown in FIG. 5.

The heat sink is retained on the device by a resilient retainer clip 18 that biases the sink into tight thermally conductive relation to the electronic device 10. That is, the lower surface of the heat sink 13 is forced against the upper surface of the electronic device 10. In addition, the biased clip provides positive electrical conduction by adding pressure to both the EMC finger and the heat sink. In accordance with the present invention the resilient retainer clip 18 is made of a conductive material. In an alternative embodiment the retainer clip is made of portions of electrically conductive material that permit electrical coupling of the heat sink to the EMC finger or fingers.

Generally, the retainer clip operates as a spring, and comprises a top member and two downwardly extending legs that detachably engage the lugs on the socket side walls. Clip 18 is movable relative to other clip half thus, allowing attachment to socket 41 with no destructive down force on lugs 81A and 81B. The top member is formed, so that in a side sectional view, there is a concave or bowed section in the center that bears against the heat sink forcing it into tight contact with the device. The clip 18 has a spring portion 19 that extends across the heat sink channel 15. The spring portion 19 is preferably a bent segment of the clip 18 that deflects when the clip is attached to the lugs. The clip should provide an adequate spring force to press the heat sink 16 into the electronic device 10. The clip 18 includes a first end with a first aperture 17. The first aperture 17 engages with lug 81A so that the clip 18 is electrically coupled to the EMC finger 53 and heat sink 16. The clip includes a second aperture on the second end for engaging with the lug 81B on the opposite wall of the socket (not shown) so that the clip 18 is electrically coupled to an EMC finger associated with the lug 81B, if any, and the heat sink 16. In this manner the heat sink is electrically coupled to the retainer clip and the EMC fingers. The EMC fingers can then be electrically coupled to the ground plane of the PCB.

To assemble the clip on the heat sink assembly, the clip is aligned so that the top member straps fit into the channel and is then pushed downward overcoming the spring constant force of the top member (while the legs are spread by the side wall lugs) until the legs, with openings at the lower ends for receiving the lugs, snap over the lugs and bias the heat sink downwardly into intimate engagement with the device top surface.

Other examples of suitable types of retainer clips may be found in U.S. Pat. No. 5,600,540 entitled "Heat Sink And Retainer for Electronic Integrated Circuits" hereby incorporated by reference. The clip cooperates with tabs or lugs on opposite side walls of the socket. The tabs or lugs have EMC fingers or conductive surfaces that electrically couple the retainer clip to the ground plane of the PCB.

Although illustrated using Intel family of microprocessor and AMP sockets the invention is not limited to such embodiments and may be used with any electronic device and socket. While the invention has been described in detail herein in accord with certain preferred embodiments thereof, modifications and changes therein may be affected by those skilled in the art. Accordingly, it is intended by the appended claims to cover all such modifications and changes as fall within the true spirit and scope of the invention.

What is claimed:

1. An integrated circuit socket, comprising:
   a body having at least two opposed side walls;
   a plurality of pin receptacles carried in said body and electrically coupled to one or more of a plurality of socket pins projecting downward from the body; and
   at least one lug having a conducting surface projecting laterally outward from one of said side walls; said surface forming a conductive finger having a lower portion which protrudes downward to form a pin in parallel with said socket pins.

2. The integrated circuit socket of claim 1 wherein the conductive finger forms a plurality of pins.

3. The integrated circuit socket of claim 1 further comprising:
   at least two lugs, each lug having a conductive finger.

4. The integrated circuit socket of claim 3 wherein each conductive finger forms a plurality of pins.

5. An integrated circuit socket, comprising:
   a body having at least two opposed side walls;
   a plurality of pin receptacles carried in said body and electrically coupled to one or more of a plurality of socket pins projecting downward from the body; and
   at least one lug having a conducting surface projecting laterally outward from one of said side walls; said surface forming a conductive finger having a lower portion which is electrically coupled to at least one of said socket pins via a conductive trace through the body.

6. The integrated circuit socket of claim 5 wherein the conductive finger is electrically coupled to a plurality of socket pins.

7. The integrated circuit socket of claim 5 further comprising:
   at least two lugs, each lug having a conductive finger.

8. The integrated circuit socket of claim 7 wherein each conductive finger is electrically coupled to a plurality of socket pins via one or more of the conductive traces.

9. An electronic package assembly for a printed circuit board having a ground plane, the electronic assembly comprising:
   a retainer clip,
   a heat sink with a channel;
   a semiconductor device having a plurality of pins; and
   an integrated circuit socket having
      a body with at least two opposed side walls,
      a plurality of pin receptacles carried in said body for receiving the pins from the semiconductor device and electrically coupled to one or more of a plurality of socket pins projecting downward from the body, and
      at least one lug having a conducting surface projecting laterally outward from one of said side walls; said surface forming a conductive finger having a lower portion which protrudes downward to form a pin in parallel with said socket pins, wherein the heat sink is secured to the socket by the retainer clip cooperating with the channel and the lugs, the heat sink electrically coupled to the conductive finger by the retainer clip.

10. The electronic package assembly of claim 9 wherein the conductive finger forms a plurality of pins.

11. The electronic package assembly of claim 9 further comprising:

at least two lugs, each lug having a conductive finger.

12. The electronic package assembly of claim 11 wherein each conductive finger forms a plurality of pins.

13. An electronic package assembly for a printed circuit board having a ground plane, the electronic assembly comprising:

a retainer clip;

a heat sink with a channel;

a semiconductor device having a plurality of pins; and an integrated circuit socket having
 a body with at least two opposed side walls,
 a plurality of pin receptacles carried in said body for receiving the pins from the semiconductor device and electrically coupled to one or more of a plurality of socket pins projecting downward from the body, and
 at least one lug having a conducting surface projecting laterally outward from one of said side walls; said surface forming a conductive finger having a lower portion which is electrically coupled to at least one of said socket pins via a conductive trace through the body, wherein the heat sink is secured to the socket by the retainer clip cooperating with the channel and the lugs, the heat sink electrically coupled to the conductive finger by the retainer clip.

14. The electronic package assembly of claim 13 wherein the conductive finger is electrically coupled to a plurality of socket pins via one or more conductive traces.

15. The electronic package assembly of claim 13 further comprising:

at least two lugs, each lug having a conductive finger.

16. The electronic package assembly of claim 15 wherein each conductive finger is electrically coupled to a plurality of socket pins.

17. A printed circuit board comprising:

a ground plane;

a retainer clip;

a heat sink with a channel;

a semiconductor device having a plurality of pins; and an integrated circuit socket having
 a body with at least two opposed side walls,
 a plurality of pin receptacles carried in said body for receiving the pins from the semiconductor device and electrically coupled to one or more of a plurality of socket pins projecting downward from the body, and
 at least one lug having a conducting surface projecting laterally outward from one of said side walls; said surface forming a conductive finger having a lower portion which protrudes downward to form a pin in parallel with said socket pins, wherein the heat sink is secured to the socket by the retainer clip cooperating with the channel and the lugs, the heat sink electrically coupled to the ground plane by at least one conductive finger and the retainer clip.

18. The printed circuit board of claim 17 wherein the conductive finger forms a plurality of pins.

19. The printed circuit board of claim 17 further comprising:

at least two lugs, each lug having a conductive finger.

20. The printed circuit board of claim 19 wherein each conductive finger forms a plurality of pins.

21. A printed circuit board comprising:

a ground plane;

a retainer clip;

a heat sink with a channel;

a semiconductor device having a plurality of pins; and an integrated circuit socket having
 a body with at least two opposed side walls,
 a plurality of pin receptacles carried in said body for receiving the pins from the semiconductor device and electrically coupled to one or more of a plurality of socket pins projecting downward from the body, and
 at least one lug having a conducting surface projecting laterally outward from one of said side walls; said surface forming a conductive finger having a lower portion which is electrically coupled to at least one of said socket pins via a conductive trace through the body, wherein the heat sink is secured to the socket by the retainer clip cooperating with the channel and the lugs, the heat sink electrically coupled to the ground plane by at least one socket pin, conductive trace and conductive finger and the retainer clip.

22. The electronic package assembly of claim 21 wherein the conductive finger is electrically coupled to a plurality of socket pins via one or more conductive traces.

23. The electronic package assembly of claim 21 further comprising:

at least two lugs, each lug having a conductive finger.

24. The electronic package assembly of claim 23 wherein each conductive finger is electrically coupled to a plurality of socket pins via one or more conductive traces.

* * * * *